(12) United States Patent
Chen et al.

(10) Patent No.: US 10,123,452 B2
(45) Date of Patent: Nov. 6, 2018

(54) SLIDE RAIL ASSEMBLY FOR RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Yao-Tsung Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 12 days.

(21) Appl. No.: 15/045,191

(22) Filed: Feb. 16, 2016

(65) Prior Publication Data

US 2017/0112016 A1    Apr. 20, 2017

(30) Foreign Application Priority Data

Oct. 16, 2015 (TW) .............................. 104134161 A

(51) Int. Cl.
```
A47B 88/04     (2006.01)
H05K 7/14      (2006.01)
H05K 7/18      (2006.01)
A47B 88/43     (2017.01)
```
(52) U.S. Cl.
CPC ........... *H05K 7/183* (2013.01); *A47B 88/044* (2013.01); *A47B 88/43* (2017.01); *H05K 7/1489* (2013.01)

(58) Field of Classification Search
CPC ....... A47B 88/044; A47B 88/43; A47B 88/49; H05K 7/183; H05K 7/1489; H05K 7/1491
See application file for complete search history.

(56) References Cited

U.S. PATENT DOCUMENTS

| | | | | |
|---|---|---|---|---|
| 6,230,903 B1 * | 5/2001 | Abbott | .................... | A47B 88/43 211/190 |
| 6,948,691 B2 * | 9/2005 | Brock | ...................... | H02B 1/34 211/175 |
| 7,798,582 B2 * | 9/2010 | Yu | .......................... | A47B 88/43 211/26 |
| 8,083,298 B2 * | 12/2011 | Henderson | ........... | H05K 7/1489 211/26 |
| 8,127,940 B2 * | 3/2012 | Henderson | ........... | H05K 7/1489 211/26 |
| 8,147,011 B2 * | 4/2012 | Chen | ...................... | F16C 29/04 312/333 |

(Continued)

FOREIGN PATENT DOCUMENTS

| | | |
|---|---|---|
| JP | 3188394 U | 1/2014 |
| JP | 3196887 U | 4/2015 |

(Continued)

*Primary Examiner* — Kimberley S Wright
(74) *Attorney, Agent, or Firm* — Winston Hsu

(57) ABSTRACT

A rack system includes a rack, a slide rail assembly and a chassis. The slide rail assembly is mounted to the rack. The chassis includes an upper part and a lower part. The upper part has an upper part width, and the lower part has a lower part width narrower than the upper part width. Wherein, the lower part is engaged with the slide rail assembly.

6 Claims, 5 Drawing Sheets

(56) References Cited

U.S. PATENT DOCUMENTS

| | | | | |
|---|---|---|---|---|
| 8,231,188 B1* | 7/2012 | Chen | A47B 88/57 | 312/333 |
| 8,292,382 B2* | 10/2012 | Cheng | H05K 7/1489 | 312/334.4 |
| 8,297,721 B2* | 10/2012 | Yu | A47B 88/40 | 312/333 |
| 8,317,037 B2* | 11/2012 | Henderson | H05K 7/1489 | 211/26 |
| 8,328,300 B2* | 12/2012 | Yu | A47B 88/43 | 312/333 |
| 8,356,718 B2* | 1/2013 | Yang | H05K 7/1489 | 211/26 |
| 8,371,454 B2* | 2/2013 | Chen | H05K 7/1421 | 211/26 |
| 8,770,528 B2* | 7/2014 | Chen | H05K 7/1421 | 211/26 |
| 9,066,590 B2* | 6/2015 | Wu | A47B 88/04 | |
| 9,131,624 B1 | 9/2015 | Johnson | | |
| 9,144,173 B2* | 9/2015 | Chen | H05K 7/1489 | |
| 9,161,625 B2* | 10/2015 | Chen | A47B 88/43 | |
| 9,237,671 B2* | 1/2016 | Chen | H05K 7/1489 | |
| 9,328,769 B1 | 5/2016 | Chen | | |
| 9,363,921 B1* | 6/2016 | Chen | H05K 7/1489 | |
| 9,370,120 B2* | 6/2016 | Chen | A47B 96/025 | |
| 9,474,182 B1* | 10/2016 | Chen | H05K 7/1489 | |
| 9,498,061 B2 | 11/2016 | Liang | | |
| 9,545,153 B2* | 1/2017 | Chen | H05K 7/1489 | |
| 9,867,308 B2* | 1/2018 | Chen | H05K 7/1489 | |
| 9,894,798 B2* | 2/2018 | Chen | H05K 7/183 | |
| 2001/0040142 A1* | 11/2001 | Haney | H05K 7/1421 | 211/183 |
| 2001/0040203 A1* | 11/2001 | Brock | H02B 1/34 | 248/222.11 |
| 2002/0108914 A1* | 8/2002 | Abbott | H02B 1/36 | 211/26 |
| 2002/0158556 A1* | 10/2002 | Cheng | H05K 7/1489 | 312/333 |
| 2003/0141791 A1 | 7/2003 | Dubon | | |
| 2004/0020874 A1* | 2/2004 | Haney | H05K 7/1421 | 211/26 |
| 2006/0152115 A1* | 7/2006 | Dubon | A47B 88/43 | 312/334.8 |
| 2007/0018547 A1* | 1/2007 | Yang | H05K 7/1489 | 312/333 |
| 2007/0114895 A1* | 5/2007 | Chen | H05K 7/1489 | 312/333 |
| 2009/0261699 A1* | 10/2009 | Yu | A47B 88/43 | 312/334.46 |
| 2009/0310894 A1* | 12/2009 | Yu | H05K 7/1489 | 384/21 |
| 2010/0007255 A1* | 1/2010 | Cheng | H05K 7/1489 | 312/334.44 |
| 2010/0314337 A1* | 12/2010 | Yang | H05K 7/1489 | 211/26 |
| 2011/0240580 A1* | 10/2011 | Yu | H05K 7/1489 | 211/183 |
| 2012/0312943 A1* | 12/2012 | Fan | H05K 7/1489 | 248/222.11 |
| 2014/0217049 A1* | 8/2014 | Chen | H05K 7/1489 | 211/195 |
| 2014/0265786 A1* | 9/2014 | Chen | A47B 88/43 | 312/334.1 |
| 2014/0339975 A1* | 11/2014 | Fan | A47B 88/04 | 312/334.1 |
| 2015/0123528 A1* | 5/2015 | Wu | A47B 88/04 | 312/319.1 |
| 2015/0129526 A1* | 5/2015 | Chen | A47B 88/044 | 211/134 |
| 2015/0136722 A1* | 5/2015 | Chen | H05K 7/1489 | 211/175 |
| 2015/0201754 A1* | 7/2015 | Chen | A47B 96/025 | 248/219.3 |
| 2016/0157610 A1* | 6/2016 | Chen | A47B 88/43 | 248/219.3 |
| 2016/0198855 A1 | 7/2016 | Liang | | |
| 2016/0235196 A1* | 8/2016 | Chen | A47B 88/493 | |
| 2016/0278522 A1* | 9/2016 | Chen | H05K 7/1489 | |
| 2016/0324317 A1* | 11/2016 | Chen | H05K 7/1489 | |
| 2016/0331136 A1* | 11/2016 | Chen | H05K 7/1489 | |

FOREIGN PATENT DOCUMENTS

| | | |
|---|---|---|
| JP | 3197165 U | 4/2015 |
| JP | 3197420 U | 5/2015 |
| JP | 3197483 U | 5/2015 |
| JP | 3198043 U | 6/2015 |

* cited by examiner

SLIDE RAIL ASSEMBLY FOR RACK SYSTEM

BACKGROUND OF THE INVENTION

1. Field of the Invention

The present invention relates to a slide rail assembly, and more particularly, to a slide rail assembly for a rack system.

2. Description of the Prior Art

In the network communication industry, lots of electronic or information devices can be installed in a cabinet or a rack, in order to facilitate a staff to maintain or manage the electronic or information devices. The cabinet or rack generally comprises a plurality of posts arranged with slide rail assemblies for carrying the devices. For example, U.S. Pat. No. 9,131,624 B1 discloses a rack-mountable device. Specifically, the patent mainly discloses a device (12), which can be mounted to a frame (18) of a rack (10) by a pair of slide assemblies (20, 22). According to an embodiment of the above patent, a device (100) comprises a chassis (102), which has a forward portion (104) and a rearward portion (106). Wherein, the forward portion (104) has a forward portion width, the rearward portion (106) has a rearward portion width narrower than the forward portion width, and the pair of slide assemblies (20, 22) are mounted to two sides of the rearward portion (106) of the chassis (102). When the pair of slide assemblies (20, 22) are attached to the two sides of the rearward portion (106) of the chassis (102), a total width of the rearward portion (106) and the pair of slide assemblies (20, 22) is approximately equal to the forward portion width. However, since different devices may have different shapes, a topic of carrying a device in a particular shape by slide assemblies is important in the industry.

SUMMARY OF THE INVENTION

The present invention relates to a slide rail assembly for a rack system.

According to an embodiment of the present invention, a rack system comprises a rack, a first slide rail assembly, a second slide rail assembly and a chassis. The rack comprises at least one first post and at least one second post. The first slide rail assembly is mounted to the at least one first post of the rack. The second slide rail assembly is mounted to the at least one second post of the rack. The chassis comprises an upper part and a lower part. The upper part has an upper part width, and the lower part has a lower part width narrower than the upper part width. The lower part has a first side and a second side. Wherein, the first side of the lower part is engaged with the first slide rail assembly, and the second side of the lower part is engaged with the second slide rail assembly.

According to the above embodiment, the chassis comprises a pair of first posts and a pair of second posts. The first slide rail assembly is mounted between the pair of first posts, and the second slide rail assembly is mounted between the pair of second posts.

Preferably, each of the first side and the second side of the lower part of the chassis is arranged with at least one mounting element. Each of the first slide rail assembly and the second slide rail assembly comprises a support rail. The support rail comprises a mounting part, and an engagement path is formed on the mounting part for accommodating the at least one mounting element.

Preferably, the mounting part of the support rail comprises an entrance and a closed section. The engagement path is located between the entrance and the closed section.

Preferably, the mounting part of the support rail further comprises an upper blocking wall and a lower blocking wall. The engagement path is defined by the upper blocking wall, the lower blocking wall and the closed section.

Preferably, each of the first slide rail assembly and the second slide rail assembly comprises a first rail and a second rail mounted to the first rail. The support rail is attached to the first rail. The first rail and the second rail are arranged with a first bracket and a second bracket respectively. Each of the first slide rail assembly and the second slide rail assembly is mounted to the rack by the corresponding first bracket and the corresponding second bracket.

According to another embodiment of the present invention, a slide rail assembly is configured to carry a chassis. The chassis comprises an upper part and a lower part. The upper part has an upper part width and the lower part has a lower part width narrower than the upper part width. The lower part has one side arranged with at least one mounting element. The slide rail assembly comprises a first rail and a support rail attached to the first rail. The support rail comprises a supporting part and a mounting part bent from the supporting part. The supporting part is configured to support the upper part of the chassis. An engagement path is formed on the mounting part for accommodating the at least one mounting element arranged at the side of the lower part of the chassis.

According to another embodiment of the present invention, a slide rail assembly comprises a first rail and a support rail. The first rail comprises an upper wall, a lower wall and a longitudinal wall connected between the upper wall and the lower wall. The support rail is attached to the first rail. The support rail comprises a connection part, an extension part, a supporting part and a mounting part. The connection part is connected to the longitudinal wall of the first rail. The extension part has a first section and a second section. The first section is connected to the connection part and away from the longitudinal wall of the first rail. The second section is connected between the first section and the supporting part. At least one portion of the supporting part of the support rail abuts against the upper wall of the first rail. The mounting part is bent from the supporting part and connected to the extension part.

According to the above embodiment, the slide rail assembly further comprises a second rail, a first bracket and a second bracket. The first bracket is connected to the first rail and adjacent to a first end of the first rail. The second bracket is connected to the second rail and adjacent to a second end of the second rail. A passage is defined by the upper wall, the lower wall and the longitudinal wall of the first rail. At least one portion of the second rail is arranged in the passage of the first rail.

According to the above embodiment, the first rail further comprises a first bent wall bent from the upper wall. The support rail further comprises a bent part bent from the supporting part. The bent part of the support rail is configured to abut against the first bent wall of the first rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
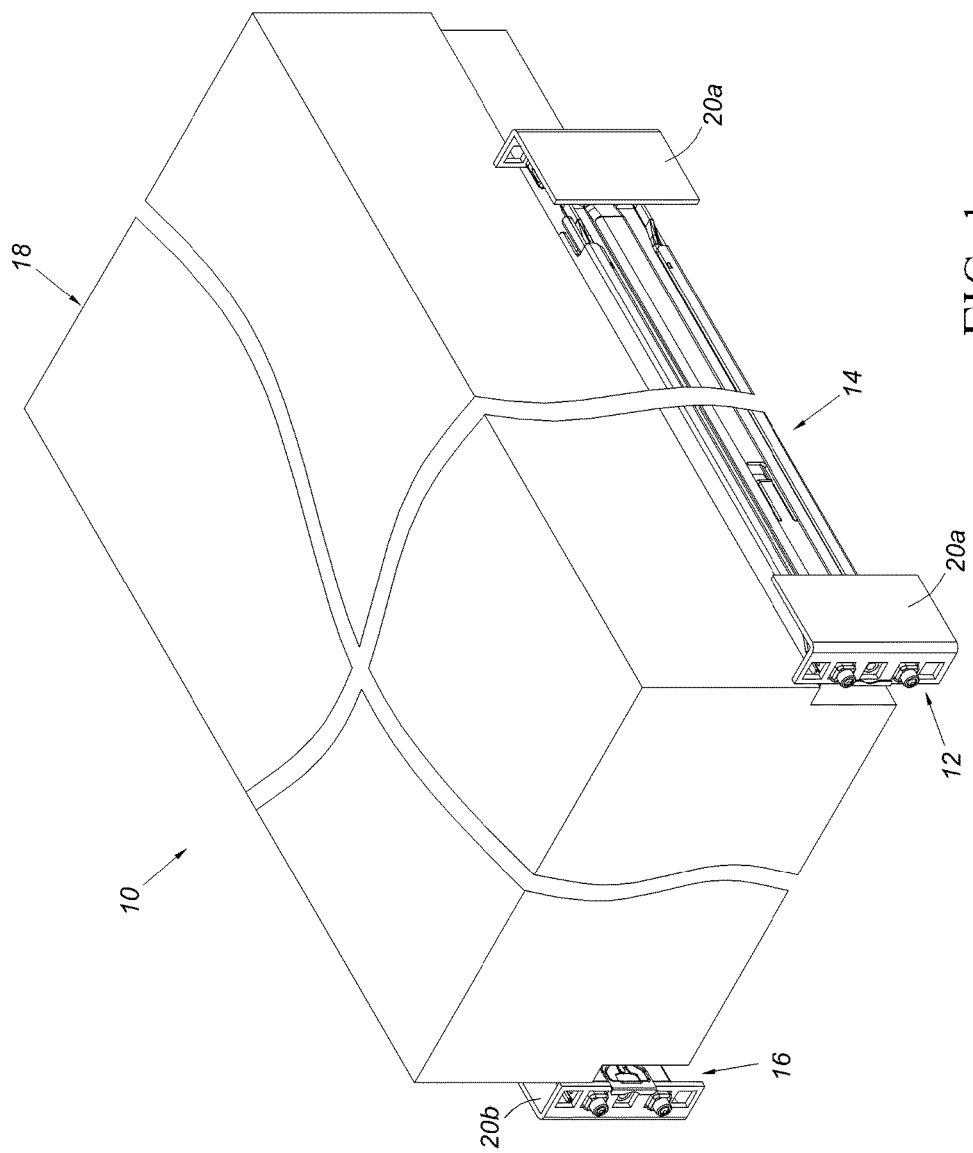
FIG. 1 is a diagram showing a rack system according to an embodiment of the present invention.

As shown in FIG. 1, a rack system 10 of the present invention comprises a rack 12, a first slide rail assembly 14, a second slide rail assembly 16 and a chassis 18. The rack 12 comprises a pair of first posts 20a and a pair of second posts 20b. (Due to the view angle in FIG. 1, FIG. 1 only shows one second post 20b.) The first slide rail assembly 14 is mounted between the pair of first posts 20a. The second slide rail assembly 16 is mounted between the pair of second posts 20b. The chassis 18 is mounted to the rack 12 by the first slide rail assembly 14 and the second slide rail assembly 16.

Figure 2:
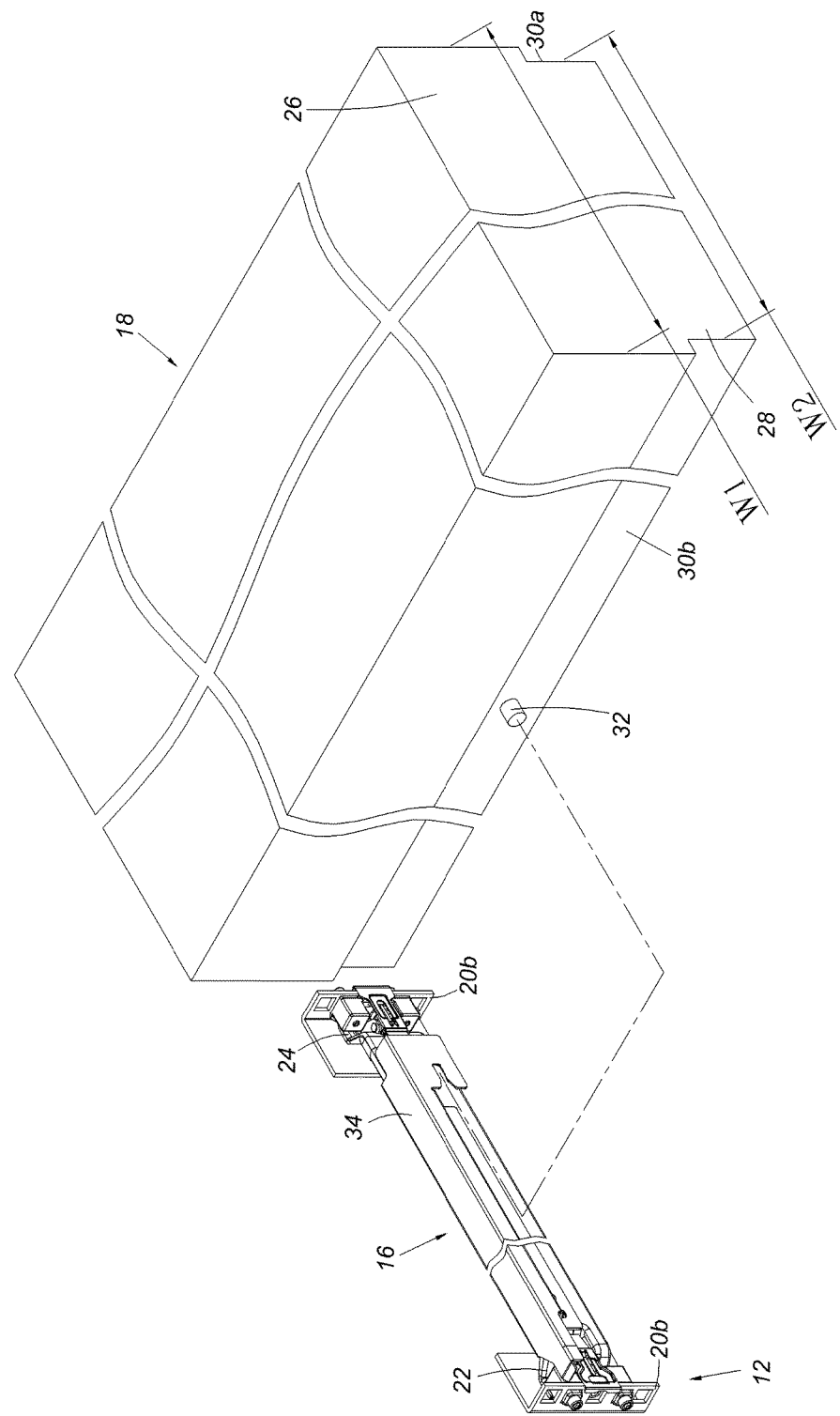
FIG. 2 is an exploded view of a chassis and a slide rail assembly according to an embodiment of the present invention.

As shown in FIG. 1 and FIG. 2, structure arrangements of the first slide rail assembly 14 and the second slide rail assembly 16 are substantially identical. Thus the second slide rail assembly 16 is illustrated for example. The second slide rail assembly 16 comprises a first bracket 22 and a second bracket 24 respectively mounted to the pair of second posts 20b of the rack 12. The chassis 18 is in a T shape. The chassis 18 comprises an upper part 26 and a lower part 28. The upper part 26 has an upper part width W1, and the lower part has a lower part width W2, wherein the lower part width W2 is narrower than the upper part width W1. Preferably, the lower part 28 is substantially perpendicular to the upper part 26. The lower part 28 of the chassis 18 has a first side 30a and a second side 30b. Each of the first side 30a and the second side 30b can be arranged with at least one mounting element 32. The first side 30a is engaged with the first slide rail assembly 14, and the second side 30b is engaged with the second slide rail assembly 16. For example, on the second side 30b of the lower part 28 of the chassis 18, the at least one mounting element 32 on the second side 30b can be a stud or a protrusion for being mounted to a support rail 34 of the second slide rail assembly 16.

Figure 3:
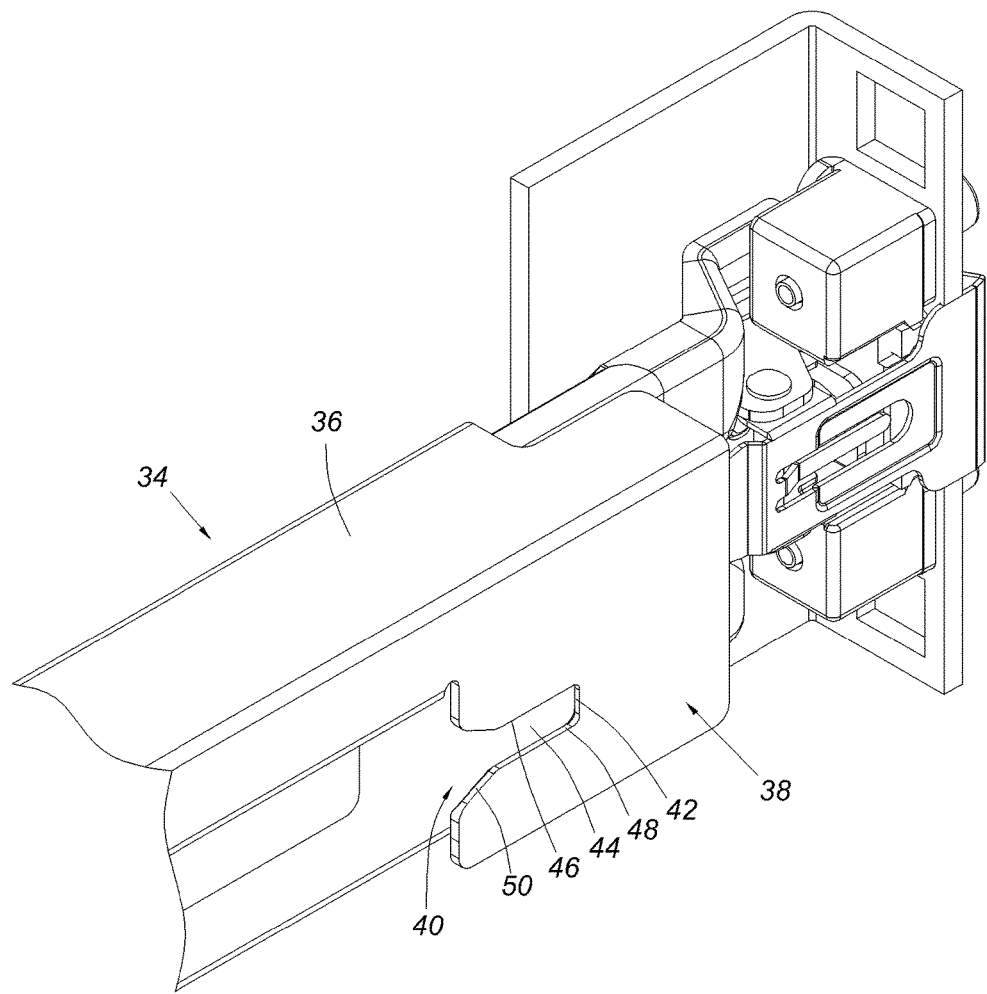
FIG. 3 is a partial view of the slide rail assembly according to an embodiment of the present invention.

As shown in FIG. 2 and FIG. 3, the support rail 34 comprises a supporting part 36 and a mounting part 38. Preferably, the mounting part 38 of the support rail 34 is bent from the supporting part 36. In the present embodiment, the mounting part 38 is substantially perpendicularly connected to the supporting part 36, and the mounting part 38 is located adjacent to an end of the support rail 34. More particularly, the mounting part 38 of the support rail 34 comprises an entrance 40 and a closed section 42. An engagement path 44 is formed and located between the entrance 40 and the closed section 42. The mounting part 38 further comprises an upper blocking wall 46 and a lower blocking wall 48. The engagement path 44 is defined by the upper blocking wall 46, the lower blocking wall 48 and the closed section 42. Preferably, the mounting part 38 of the support rail 34 further comprises a guiding part 50, such as an inclined surface located adjacent to the entrance 40. The at least one mounting element 32 on the lower part 28 of the chassis 18 can be guided by the guiding part 50 to enter the engagement path 44. In other words, the engagement path 44 is configured to accommodate the at least one mounting element 32 on the lower part 28 of the chassis 18.

Figure 4:
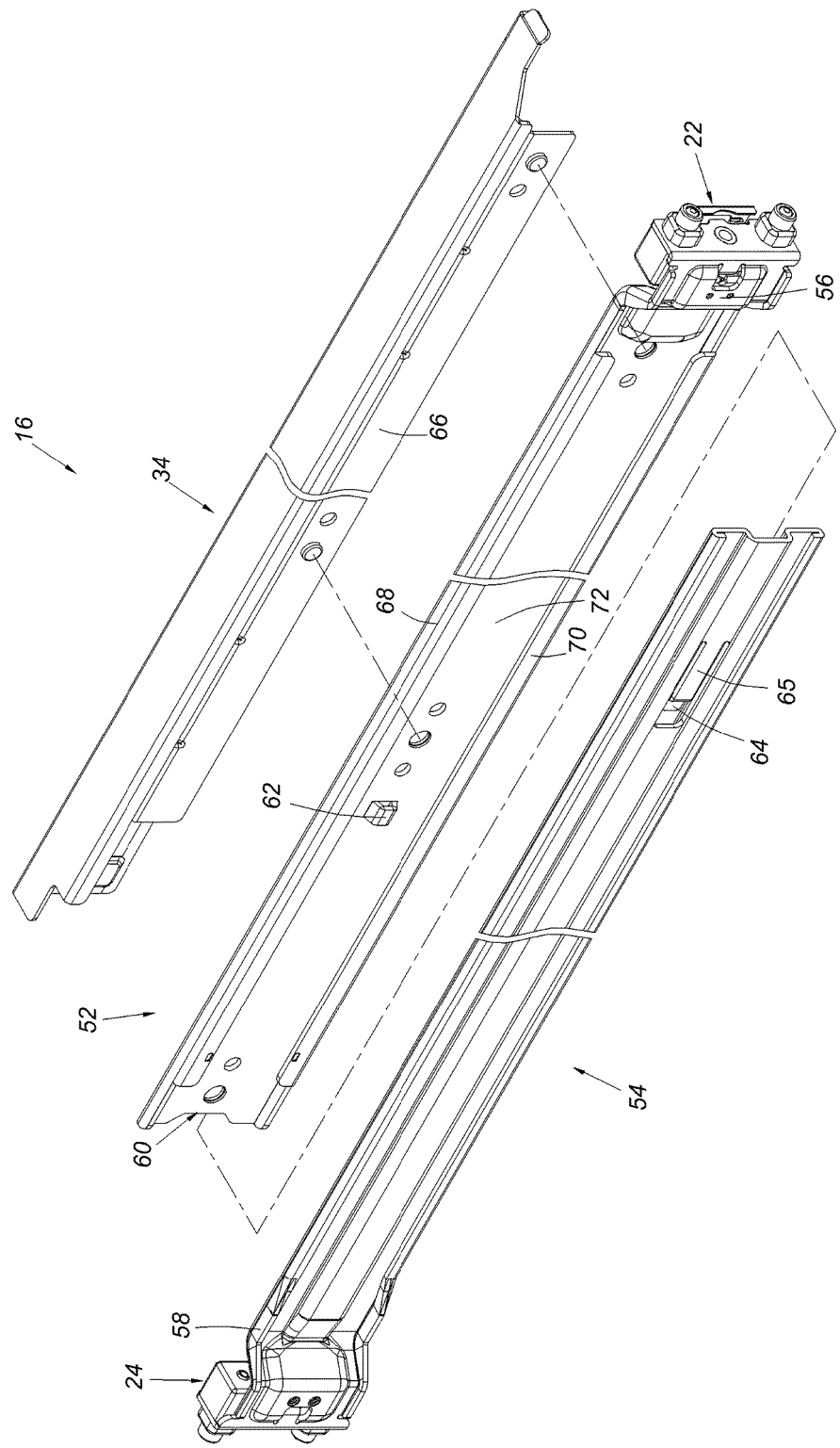
FIG. 4 is an exploded view of the slide rail assembly according to an embodiment of the present invention.

As shown in FIG. 4, the second slide rail assembly 16 further comprises a first rail 52 and a second rail 54. The first bracket 22 is connected to the first rail 52. The second bracket 24 is connected to the second rail 54. Preferably, the first bracket 22 is connected to or directly formed on the first rail 52 and adjacent to a first end 56 (such as a front end) of the first rail 52. The second bracket 24 is connected to or directly formed on the second rail 54 and adjacent to a second end 58 (such as a rear end) of the second rail 54. The first rail 52 has a passage 60. At least one portion of the second rail is arranged in the passage 60 of the first rail 52, such that the second rail 52 is movable relative to the first rail 52 along the passage 60. That is to say, a relative distance between the second bracket 24 and the first bracket 22 can be adjusted in response to different distances between two posts of the rack 12. Preferably, the first rail 52 has a first limiting feature 62, and the second rail 54 has a second limiting feature 64 arranged at a position corresponding to the first limiting feature 62. Wherein, the second limiting feature 64 has an elastic arm 65. The second limiting feature 64 can cross the first limiting feature 62 with assistance of the elastic arm 65. With arrangement of the first limiting feature 62 and the second limiting feature 64, the second rail 54 can move relative to the first rail 52 within a limited range. The support rail 34 is attached to the first rail 52. In the present embodiment, the support rail 34 has a connection part 66, which can be connected to the first rail 52 by riveting, welding, screwing, or engaging.

Figure 5:
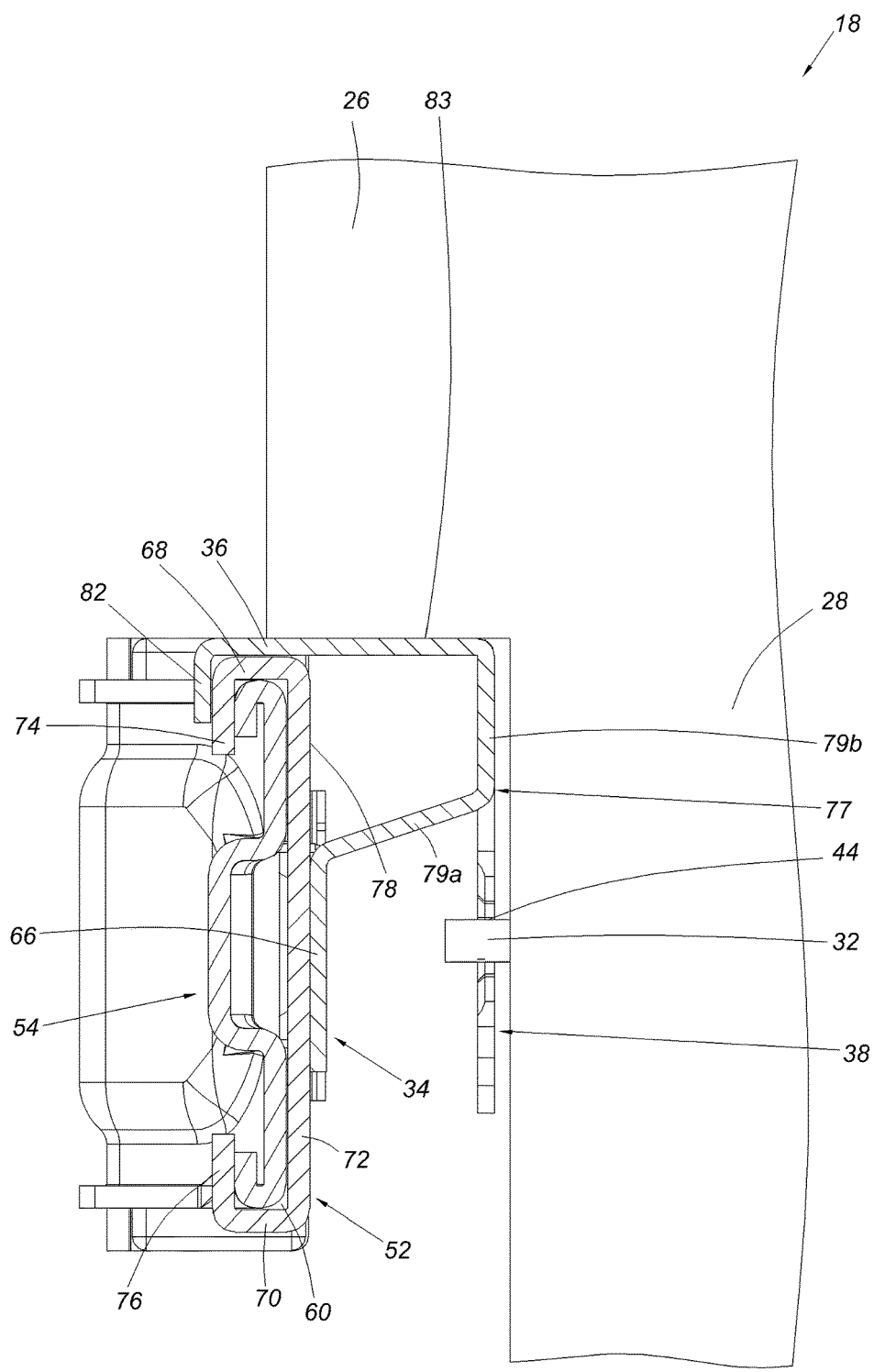
FIG. 5 is a partial view of the slide rail assembly carrying the chassis according to an embodiment of the present invention.

As shown in FIG. 5, the first rail 52 comprises an upper wall 68, a lower wall 70 and a longitudinal wall 72 connected between the upper wall 68 and the lower wall 70. Preferably, the first rail 52 further comprises a first bent wall 74 bent downward from the upper wall 68, and a second bent wall 76 bent upward from the lower wall 70. The passage 60 is defined by the upper wall 68, the lower wall 70, the longitudinal wall 72, the first bent wall 74 and the second bent wall 76. At least one portion of the second rail 54 is arranged in the passage 60 of the first rail 52. The support rail 34 further comprises an extension part 77. Specifically, the connection part 66 of the support rail 34 is connected to a back side 78 (different from a side of the passage 60) of the longitudinal wall 72 of the first rail 52. The extension part 77 has a first section 79a and a second section 79b. The first section 79a is connected to the connection part 66 and away from the longitudinal wall 72. The second section 79b is connected between the first section 79a and the supporting part 36. At least one portion of the supporting part 36 of the support rail 34 abuts against the upper wall 68 of the first rail 52. The mounting part 38 is bent from the supporting part 36 and connected to the second section 79b of the extension part 77. Preferably, the support rail 34 further comprises a bent part 82 bent from the supporting part 36. The bent part 82 is configured to abut against the first bent wall 74 of the first rail 52.

When the chassis 18 is mounted to the support rail 34, the supporting part 36 of the support rail 34 can be configured to support the upper part 26 of the chassis 18 in order to carry the chassis 18. Wherein, a surface 83 of the supporting part 36 can be horizontally extended due to arrangement of the extension part 77. That is to say, a contact area between the supporting part 36 and the upper part 26 of the chassis 18 is increased accordingly. On the other hand, the mounting part 38 of the support rail 34 can be configured to mount the lower part 28 of the chassis 18. More particularly, the at least one mounting element 32 on the lower part 28 of the chassis 18 can be mounted to the engagement path 44 of the mounting part 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rack system, comprising:
a rack comprising at least one first post and at least one second post;
a first slide rail assembly mounted to the at least one first post of the rack and comprising a first rail;
a second slide rail assembly mounted to the at least one second post of the rack; and
a chassis comprising an upper part and a lower part, the upper part having an upper part width, the lower part having a lower part width narrower than the upper part width, and the lower part having a first side and a second side, wherein the first side of the lower part is engaged with the first slide rail assembly, and the second side of the lower part is engaged with the second slide rail assembly;
wherein each of the first side and the second side of the lower part of the chassis is arranged with at least one mounting element protruded from the chassis, each of the first slide rail assembly and the second slide rail assembly comprises a support rail, and the support rail comprises a supporting part, a mounting part, an extension part and a connection part, the mounting part is located adjacent to an end of the support rail, the supporting part abuts against a bottom of the upper part of the chassis, the connection part is connected to the first rail, the extension part has a first section and a second section, the second section is connected between the first section and the supporting part, the first section is connected to the connection part and away from the first rail, such that the second section of the extension part is spaced from the connection part by a distance, an engagement path is formed on the mounting part for accommodating the at least one mounting element protruded from the chassis.

2. The rack system of claim 1, wherein the rack comprises a pair of first posts and a pair of second posts, the first slide rail assembly is mounted between the pair of first posts, and the second slide rail assembly is mounted between the pair of second posts.

3. The rack system of claim 1, wherein the mounting part of the support rail comprises an entrance and a closed section, and the engagement path is located between the entrance and the closed section.

4. The rack system of claim 3, wherein the mounting part of the support rail further comprises an upper blocking wall and a lower blocking wall, and the engagement path is defined by the upper blocking wall, the lower blocking wall and the closed section.

5. The rack system of claim 1, wherein each of the first slide rail assembly and the second slide rail assembly further comprises a second rail mounted to the first rail, the support rail is attached to the first rail, the first rail and the second rail are arranged with a first bracket and a second bracket respectively, and each of the first slide rail assembly and the second slide rail assembly is mounted to the rack by the corresponding first bracket and the corresponding second bracket.

6. The rack system of claim 1, wherein the engagement path is configured to receive the at least one mounting element from outside the engagement path along a longitudinal direction of the support rail.

* * * * *